United States Patent [19]

Hintzmann et al.

[11] 4,177,480
[45] Dec. 4, 1979

[54] INTEGRATED CIRCUIT ARRANGEMENT WITH MEANS FOR AVOIDING UNDESIRABLE CAPACITIVE COUPLING BETWEEN LEADS

[75] Inventors: Kurt Hintzmann, Leingarten; Reinhold Kaiser, Heilbronn-Sontheim; Wolfgang Link; Willy Minner, both of Schwaigern; Dieter Mutz, Heilbronn-Frankenbach; Manfred Salomon, Leingarten; Arnim Wingert, Heilbronn, all of Fed. Rep. of Germany

[73] Assignee: Licentia Patent-Verwaltungs-G.m.b.H., Frankfurt, Fed. Rep. of Germany

[21] Appl. No.: 900,647

[22] Filed: Apr. 26, 1978

Related U.S. Application Data

[63] Continuation of Ser. No. 728,878, Oct. 1, 1976, abandoned.

[30] Foreign Application Priority Data

Oct. 2, 1975 [DE] Fed. Rep. of Germany ....... 2543968

[51] Int. Cl.² .................. H01L 49/00; H01L 25/04; H01L 29/40

[52] U.S. Cl. .................... 357/84; 357/52; 357/53; 357/72; 29/588
[58] Field of Search .............. 357/53, 84, 52, 72; 29/588

[56] References Cited

U.S. PATENT DOCUMENTS

| 3,436,612 | 4/1969 | Grosvalet | 357/53 |
| 3,489,953 | 1/1970 | Thomas | 357/53 |
| 3,518,494 | 6/1970 | James | 357/84 |
| 3,518,504 | 6/1970 | Dietrich | 357/84 |
| 3,614,546 | 1/1970 | Avins | 357/84 |

FOREIGN PATENT DOCUMENTS

1204805  9/1970  United Kingdom ............ 357/53

Primary Examiner—Andrew J. James
Attorney, Agent, or Firm—Spencer & Kaye

[57] ABSTRACT

An integrated circuit arrangement comprises a semiconductor body carrying an integrated circuit which is embedded in an insulating material casing together with a plurality of flat strip lines for making electrical connection with the semiconductor body, and a layer of electrically conductive material in or on the casing in a plane substantially parallel to the flat strip lines only on the side of the semiconductor body in which the construction elements forming the integrated circuit are located.

22 Claims, 4 Drawing Figures

4,177,480

INTEGRATED CIRCUIT ARRANGEMENT WITH MEANS FOR AVOIDING UNDESIRABLE CAPACITIVE COUPLING BETWEEN LEADS

CROSS REFERENCE TO RELATED APPLICATION

This application is a continuation of applicants' co-pending United States Patent application Ser. No. 728,878, filed Oct. 1, 1976, now abandoned.

BACKGROUND OF THE INVENTION

The invention relates to an integrated circuit arrangement particularly for amplifiers, the semiconductor body of which is embedded in an insulating material, together with flat supply lines not running on the semiconductor body.

With integrated amplifiers, the semiconductor body of which is embedded in an insulating material, the dielectric constant of which is greater than the dielectric constant of air, there is a danger that the amplifier will oscillate. Above all, this danger arises, if flat supply lines are present.

SUMMARY OF THE INVENTION

It is an object of the invention to provide a simple solution which prevents undesirable oscillations from occurring in an integrated circuit arrangement having an insulating material casing.

According to a first aspect of the invention, there is provided an integrated circuit arrangement comprising a semiconductor body carrying an integrated circuit, an insulating material casing embedding said semiconductor body, a plurality of flat strip lines in said insulating material casing for electrical connection with said semiconductor body, and an electrically conductive areal element in or on said insulating material casing in a plane substantially parallel to said flat strip lines at a side of said semiconductor body in which the devices forming the integrated circuit are located.

According to a second aspect of the invention, there is provided an integrated circuit arrangement, particularly an amplifier, the semiconductor body of which is embedded in insulating material together with flat supply lines not running on the semiconductor body, characterized in that an electrically conductive areal element, which runs substantially parallel to the plane in which the parts of the flat supply lines embedded in the insulating material and associated with the connecting points of the semiconductor body are located, is present in said insulating material or on the surface of said insulating material casing only on the side of said semiconductor body on which the devices forming the integrated circuit are located in the semiconductor body; that the surface of said electrically conductive element projected on to the plane of said flat supply lines extends from one supply line to another between which an undesirable capacitance occurs which makes decoupling necessary; and that said electrically conductive element is connected to a reference potential.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
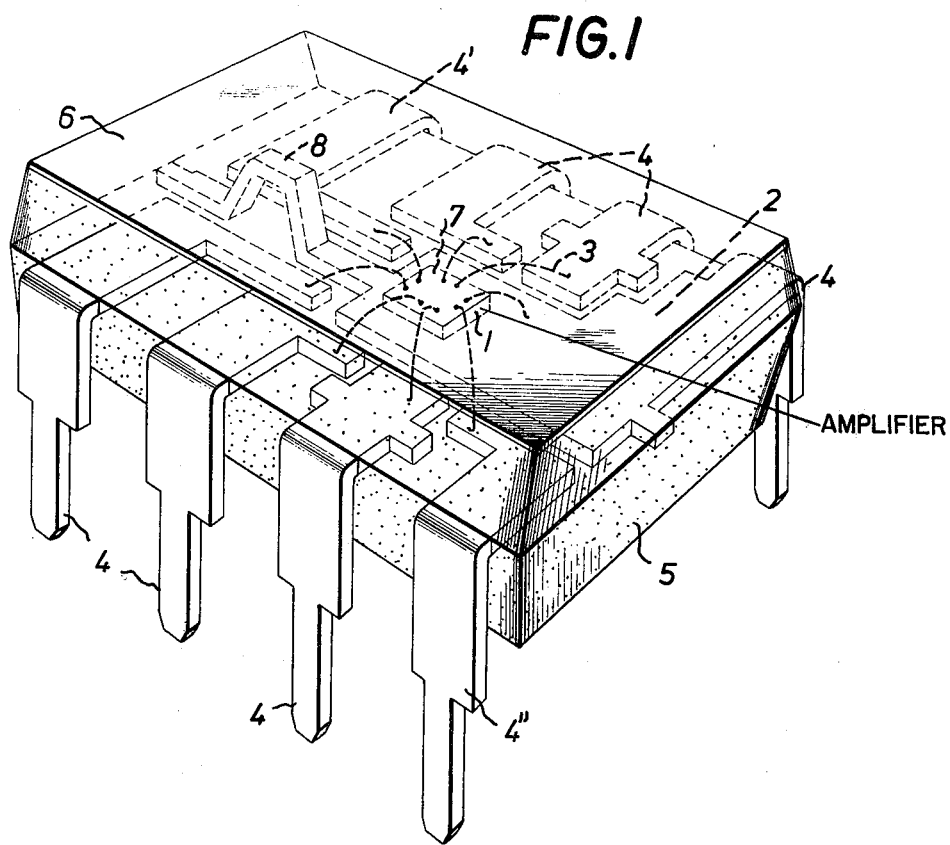
FIG. 1 is a perspective view of an integrated circuit arrangement in accordance with the invention.

In a preferred embodiment of the invention, it is proposed, in an integrated circuit arrangement of the type mentioned at the outset, that an electrically conductive element should be present in the insulating material or on the surface of the insulating material casing only on that side of the semiconductor body on which the devices of the integrated circuit are located in the semiconductor body. This coating runs substantially parallel to that plane in which those parts of the flat supply line embedded in the insulating material and associated with the connecting points in the semiconductor body are located. It is further proposed that the surface of the electrically conductive element projected on to the plane of the flat supply lines extends from that supply line to the supply line between which undesirable capacitance occurs, which makes decoupling necessary, and that the electrically conductive element is connected to the reference potential.

By reference potential is meant generally the electrode common to the input and output of a four terminal element, e.g. of an amplifier. For the invention it is not decisive that the electrically conductive element runs across the semiconductor body, but it is decisive that the electrically conductive element provided runs between the flat supply lines to be decoupled. Where possible the electrically conductive element should also actually cover the flat supply lines to be decoupled and in fact they should be covered such that the desired decoupling is achieved. By an electrically conductive element is meant for example an electrically conductive layer, an electrically conductive plate, such as a metal plate, a metal sheet or the like.

Above all the invention has proved useful in integrated circuit arrangements in which the connections are connected to flat supply lines wherein these supply lines are embedded together with the semiconductor body in an insulating material so that capacitative coupling may occur via the insulating material, as a dielectric, between certain supply lines, particularly between the supply lines for the input and the output of the amplifier. The danger of capacittive coupling is all the greater the flatter the supply lines, and the supply line wires, to which the connections of the integrated circuit arrangement are connected.

The electrically conductive element, which serves as a decoupling means, does not intersect the plane in which the parts of the supply lines which are embedded in the plastics material lie, and thus does not run between the supply lines. If the parts of the supply lines embedded in the insulating material run parallel to the main surfaces of the semiconductor body, then the electrically conductive element also runs parallel to the main surfaces. The concept "substantially parallel" should express the fact that the conductive element runs generally parallel to the plane of the supply lines, yet the electrically conductive element can obviously also assume a certain yet generally only a slightly inclined position to the plane of the supply lines. Thus it is essential for the invention that the electrically conductive element should not intersect, as does a screening means, the plane in which the parts of the supply lines, embedded in the insulating material, lie and thus is not arranged between the supply lines but runs, as a decoupling means, substantially parallel to the plane of the parts of the supply lines, inserted in the insulating material. The fact that a conductive element which is present on the surface of the insulating material casing or in the insulating material and which does not intersect the plane of the supply lines, and is thus located outside the region of the supply lines, may avoid oscillations from occurring is surprising.

The electrically conductive element has such a surface area that interfering capacitances between the supply lines are prevented. For this purpose the surface of the electrically conductive element projected on to the plane of the supply lines extends preferably from one supply line to another between which the undesirable capacitance occurs and extends generally over the supply lines to be uncoupled.

The invention has nothing to do with metallic cooling elements which are present on insulating material casings of integrated circuits. Moreover, cooling elements are also present in integrated circuit arrangements on the lower side of the semiconductor body and thus not on that side of the semiconductor body on which the devices of the integrated circuit are located in the semiconductor body. Rather the invention finds application in integrated circuit arrangements in which problems of oscillation play a substantial part. If appropriate electrical powers are not being used, then cooling problems generally do not occur at all in these integrated circuit arrangements. The invention may be used preferably in integrated amplifiers, the loss of power of which is smaller than 1 watt and lies preferably between 50 mW and 300 mW. The electrically conductive element provided as a decoupling means does not need to be as thick as a cooling plate in order to achieve the desired effect and may be arranged for example also in the insulating material, something which is not usually possible with a cooling plate. However, for considerations relating to manufacture an electrically conductive element is preferred on the surface of the insulating material casing.

The insulating material casing of integrated circuit arrangements generally has a rectangular cross-section. In such an insulating material casing, side faces and two surfaces are present which are opposite the main surfaces of the semiconductor body. In such an insulating material casing, the electrically conductive element is applied to that surface of the insulating material casing which lies opposite the main surface of the semiconductor body from where the construction elements of the integrated circuit arrangement extend into the semiconductor body.

The electrically conductive element provided is preferably connected to earth. For this purpose the electrically conductive element is preferably connected to that electrode which contacts the semiconductor body. This electrode is also called a substrate electrode. If the semiconductor body is soldered or glued for example to a carrier strip, then the electrically conductive element is connected so as to be electrically conductive in order to provide an earth connection to this carrier strip. This connection is formed, for example, by the semiconductor body carrier strip having an extension in the shape of a metal bracket which is bent upwardly so that it touches the electrically conductive element and thus makes a connection with the electrically conductive element.

With the aid of the invention it is possible, for example, to manufacture integrated operational amplifiers with an insulating material casing, with the operational amplifiers having an idling amplification of 160 to 170 dB instead of an idling amplification of 70 to 90 dB and an operating amplification of 90 dB at 40 kHz instead of an operating amplification of 10 to 50 dB without there being the danger that the amplifier will oscillate.

Figure 2:
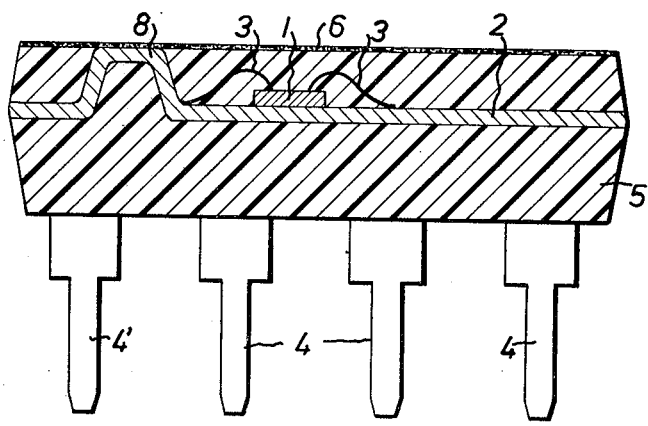
FIG. 2 is a sectional view of the arrangement shown in FIG. 1.

Referring now to the drawings, in FIGS. 1 and 2, a semiconductor body 1 of an integrated circuit arrangement is soldered or glued on to a carrier strip 2. The connections or connection points located on the surface of the semiconductor body 1 are connected via supply line wires 3 to the flat supply lines assigned to the individual connections, these supply lines are designated in the following description as strip-like supply lines 4. The strip-like supply lines 4 all lie in one plane and are embedded together with the semiconductor body 1 and the carrier strip 2 in an insulating material substance 5, which forms the casing of the integrated circuit arrangement. The strip-like supply lines (2,4) are angled off downwardly so that the integrated circuit arrangement may be plugged into a socket. Besides the strip-like supply lines 4, the supply line wires 3 also contribute to undesirable capacitative coupling.

In order that the spacing between the strip-like supply line for the input and the strip-like supply line for the output of the amplifier of FIGS. 1 and 2 should be as large as possible, the input of the amplifier is connected to the strip-like supply line 4' and the output of the amplifier is connected to the strip-like supply line 4", which is the strip-like supply line most remote from the supply line 4'. In order to improve decoupling, an electrically conductive coating 6, which extends parallel to the upper main surface 7 of the semiconductor body 1 and parallel to the plane in which the parts of the supply lines (2,4) embedded in the insulating material are located, is applied to the upper side of the insulating material casing 5 as a decoupling means, which should not be confused with a screening means. The electrically conductive coating 6 is connected electrically to the substrate connection 2 by means of a strip bracket 8. The main surface 7 is the upper surface of the semiconductor body on which the connections of the integrated circuit arrangement are located and from which the elements of the integrated circuit arrangement extend into the semiconductor body 1. As may be gathered from FIGS. 1 and 2 the electrically conductive coating 6 does not intersect the plane in which the supply lines 4 are located, but it lies across the supply lines and is arranged in this position not between any supply lines 4 and not between the supply line wires 3. In the arrangement of FIGS. 1 and 2 the feature is also fulfilled whereby the projection of the surface of the electrically conductive coating 6 onto the plane of the flat supply lines (2,4) reaches from the supply line 4' to the supply line 4", between which the interference capacitance occurs. This condition is fulfilled by the entire surface of the upper side of the insulating material casing 5 being covered by the electrically conductive coating 6.

The carrier strip 2 for the semiconductor body has a metal bracket 8 as an extension, which is bent or constructed so that it touches the electrically conductive coating 6, so that the electrically conductive coating 6 is electrically connected to the substrate electrode 2. The electrically conductive coating 6 comprises, for example, silver paste.

Figure 3:
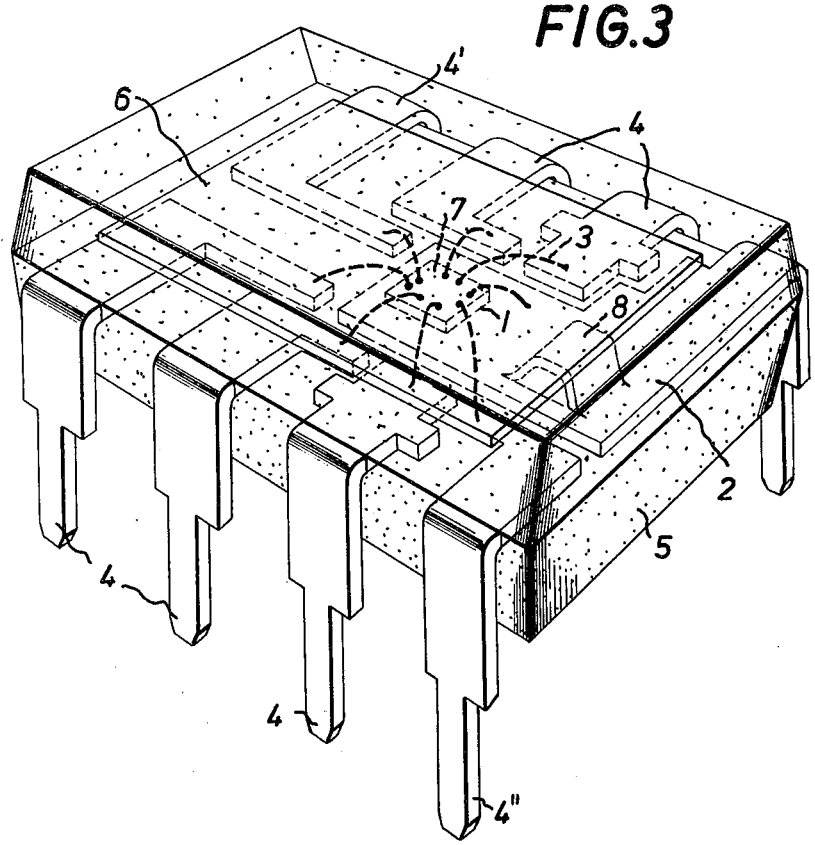
FIG. 3 is a view similar to FIG. 1 but showing a second embodiment of the invention.
Figure 4:
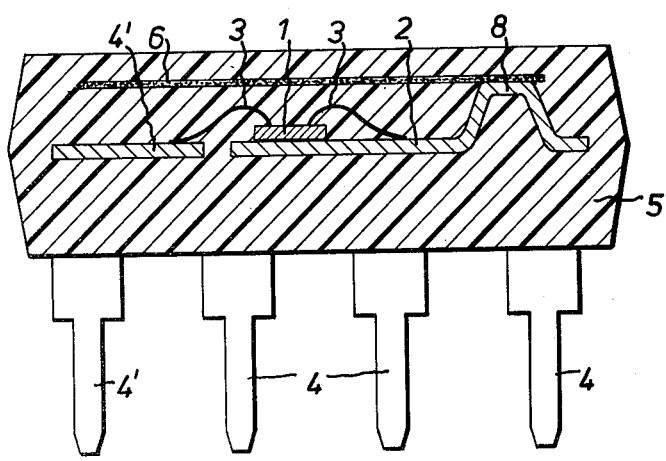
FIG. 4 is a sectional view of the arrangement shown in FIG. 3.

FIGS. 3 and 4 show an embodiment of the invention in which the electrically conductive coating 6 is not located on the surface of the insulating material casing 5 but is located inside the latter and thus embedded in the insulating material.

The electrically conductive coating 6 comprises, for example, a metal plate, a metal film or a layer of conductive silver paste, silver bronze, resistive paste or graphite. As metals, Aluminium, copper, nickel, kovar, bronze, iron or alloys of these metals are suitable. The coating capable of being electrically conductive is produced for example by vaporization, impression, brush application, spraying, galvanic separation or by dipping.

The electrically conductive coating 6 has for example a thickness of $0.01\mu$ to $300\mu$. Obviously even thicker coatings or layers or plates may be used but the desired purpose is normally achieved with coatings which are substantially thinner than $300\mu$. The thickness of the electrically conductive coating 6 generally amounts to only $0.01\mu$ to $100\mu$. The thickness of the electrically conductive coating depends on the conductivity of the material and on the method of application.

It will be understood that the above description of the present invention is susceptible to various modification changes and adaptations.

What is claimed is:

1. In an integrated circuit arrangement, particularly an amplifier, including a semiconductor body carrying an integrated circuit, said semiconductor body being embedded in a casing of insulating material together with flat supply lines which do not extend over a surface of said semiconductor body and which are connected to the contacts of said semiconductor body; the improvement wherein: an electrically conductive areal element, which extends only in a plane which is substantially parallel to the plane in which the parts of the flat supply lines embedded in the insulating material and associated with the connecting points of the semiconductor body are located, is present in said insulating material or on the surface of said insulating material casing only on the side of the surface of said semiconductor body on which the devices of the integrated circuit are located in the semiconductor body; the area of said electrically conductive areal element projected on to the plane of said flat supply lines extends from one supply line to another between which an undesirable capacitance coupling occurs which makes decoupling necessary; and means are provided for connecting said electrically conductive areal element to a reference potential.

2. An integrated circuit arrangement as defined in claim 1, wherein said electrically conductive element is a layer, a covering, a plate or a sheet.

3. An integrated circuit arrangement as defined in claim 1, wherein said electrically conductive element is neither arranged between the flat supply lines nor between supply line wires which in some cases make a connection between the flat supply lines and the connecting points of the semiconductor body.

4. An integrated circuit arrangement as defined in claim 1, wherein said electrically conductive element has a surface area sufficient to prevent interfering capacitances between the supply lines.

5. An integrated circuit arrangement as defined in claim 4, wherein said electrically conductive element extends from a flat supply line for the input of the circuit and a flat supply line for the output of the circuit.

6. An integrated circuit arrangement as defined in claim 1, wherein said electrically conductive element also at least partially covers the flat supply lines to be decoupled.

7. An integrated circuit arrangement as defined in claim 1, wherein said insulating material casing is of rectangular cross section and said electrically conductive element covers the whole of a surface of said insulating material casing, said surface running parallel to the main surfaces of said semiconductor body and lying over the main surface, contiguous with which the devices of the integrated circuit are located in the semiconductor body.

8. An integrated circuit arrangement as defined in claim 1, wherein said electrically conductive element is connected to earth.

9. An integrated circuit arrangement as defined in claim 8, and comprising a carrier strip to which said semiconductor body is applied, and wherein said means for connecting includes a metal bracket forming an extension to said carrier strip and touching said electrically conductive element.

10. An integrated circuit arrangement as defined in claim 1, wherein said insulating material of the insulating material casing has a dielectric constant which is greater than the dielectric constant of air.

11. An integrated circuit arrangement as defined in claim 1, wherein said insulating material of the insulating material casing comprises hardenable plastics material.

12. An integrated circuit arrangement as defined in claim 11, wherein said plastics material comprises an epoxy resin.

13. An integrated circuit arrangement as defined in claim 11, wherein said plastics material comprises a silicon mouldable material.

14. An integrated circuit arrangement as defined in claim 1, wherein said electrically conductive element comprises a substance taken from the group consisting of silver paste, silver bronze, resistative paste, graphite and metal.

15. An integrated circuit arrangement as defined in claim 1, wherein said electrically conductive element has a thickness of $0.01\mu$ to $300\mu$.

16. An integrated circuit arrangement as defined in claim 15, wherein said electrically conductive element has a thickness of $0.01\mu$ to $100\mu$.

17. An integrated circuit arrangement as defined in claim 1, wherein said integrated circuit comprises an amplifier with an idling amplification greater than 100 dB.

18. An integrated circuit arrangement as defined in claim 1, wherein said integrated circuit comprises an amplifier with an operating amplification greater than 70 dB.

19. An integrated circuit arrangement as defined in claim 1, wherein said integrated circuit comprises an amplifier with a loss of power smaller than 1 watt.

20. An integrated circuit arrangement as defined in claim 19, wherein said loss of power lies between 50 mW and 300 mW.

21. A method of manufacturing an integrated circuit arrangement as defined in claim 1, wherein said electrically conductive element is produced by vaporization, impression, brush application, spraying, galvanic separation or by dipping.

22. An integrated circuit arrangement as defined in claim 9 wherein said metal bracket is completely embedded in said casing of insulating material.

* * * * *